United States Patent
Shu et al.

(10) Patent No.: US 9,110,105 B2
(45) Date of Patent: Aug. 18, 2015

(54) HIGH PERFORMANCE SENSOR FOR PARTIAL DISCHARGE SIGNAL-ANALYZING SYSTEMS

(71) Applicant: UTILX Corporation, Kent, WA (US)

(72) Inventors: Wen Shu, Issaquah, WA (US); Nelson Hall, Kent, WA (US)

(73) Assignee: UTILX Corporation, Kent, WA (US)

( * ) Notice: Subject to any disclaimer, the term of this patent is extended or adjusted under 35 U.S.C. 154(b) by 363 days.

(21) Appl. No.: 13/667,952

(22) Filed: Nov. 2, 2012

(65) Prior Publication Data

US 2014/0125353 A1    May 8, 2014

(51) Int. Cl.
G01R 19/00 (2006.01)
G01R 21/00 (2006.01)
G01R 15/16 (2006.01)
G01R 31/12 (2006.01)

(52) U.S. Cl.
CPC ............ *G01R 15/16* (2013.01); *G01R 31/1272* (2013.01)

(58) Field of Classification Search
CPC ................................ G01R 19/00; G01R 21/00
USPC .................. 324/536, 551, 541, 519, 555, 658
See application file for complete search history.

(56) References Cited

U.S. PATENT DOCUMENTS

2006/0261818 A1* 11/2006 Zank et al. ................... 324/457
2007/0139056 A1* 6/2007 Kaneiwa et al. ............. 324/536

FOREIGN PATENT DOCUMENTS

| JP | 06-201759 A | 7/1994 |
|---|---|---|
| JP | 10-206476 A | 8/1998 |
| JP | 2001-249157 A | 9/2001 |
| JP | 2009-097894 B2 | 5/2009 |
| KR | 2000-0038594 A | 7/2000 |

OTHER PUBLICATIONS

International Search Report and Written Opinion mailed Feb. 13, 2014, issued in corresponding International Application No. PCT/US2013/066197, filed Oct. 22, 2013, 9 pages.

Boggs, S.A., and G.C. Stone, "Fundamental Limitations in the Measurement of Corona and Partial Discharge," IEEE Transactions on Electrical Insulation EI-17(2):143-150, Apr. 1982.

(Continued)

*Primary Examiner* — Vincent Q Nguyen
(74) *Attorney, Agent, or Firm* — Christensen O'Connor Johnson Kindness PLLC

(57) ABSTRACT

A capacitor component is adapted for capacitive coupling to an electrical power apparatus in which a PD is suspected, such as a shielded power cable; and an impedance transformance device has an input side connected directly to the capacitor component. Together the two components are used as a sensor to pick up and convey PD signals to a PD signal-analyzing system. Although the two components inherently form a classic high-pass RC filter, in accordance with the invention the input impedance at the capacitor side is much greater than the output impedance at the signal-analyzing system side. The effect is to pass much more of the lower frequency components of the PD signal for analysis by the PD signal-analyzing system than if the tranformance device were not included.

32 Claims, 12 Drawing Sheets

(56) References Cited

OTHER PUBLICATIONS

Tian, Y., et al., "Partial Discharge Detection in Cables Using VHF Capacitive Couplers," IEEE Transactions on Dielectrics and Electrical Insulation 10(2):343-353, Apr. 2003.

Oussalah, N., "Partial Discharge Pulse Propagation in Shielded Power Cable and Implications for Detection Sensitivity," IEEE Electrical Insulation Magazine 23(6):5-10, Nov./Dec. 2007.

* cited by examiner

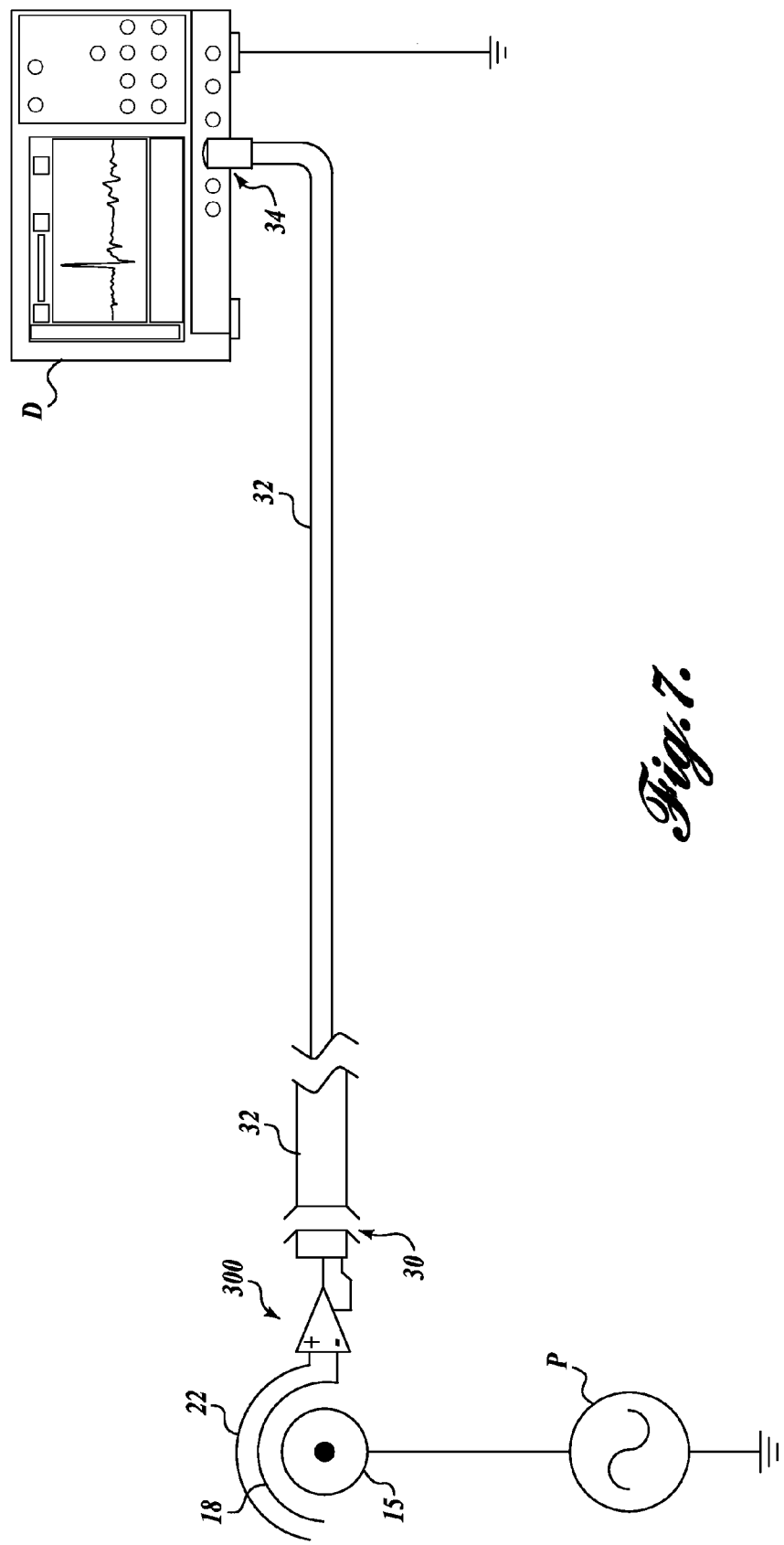

HIGH PERFORMANCE SENSOR FOR PARTIAL DISCHARGE SIGNAL-ANALYZING SYSTEMS

BACKGROUND

As electrical systems age, defects such as: cavities inside of insulating materials; thinning of insulation in motor and transformer windings; contamination across insulating surfaces; incorrect voltage to ground spacing; etc., can begin to discharge. The presence of these electrical discharges is an indicator of hidden defects which, if left unattended, can lead to system failure. In fact, the discharges themselves will, over time, degrade the material that is sustaining them also leading to system failure. Because these discharges may occur within the interior of an insulating material and because these discharge events can be very small in absolute magnitude, their presence can be unnoticeable to human senses.

A partial discharge (PD) is a flow of electrons and ions which occurs in a gas over a small volume of the total insulation system. The defects concentrate the electric stress and can degrade the dielectric. The degradation initiates within a limited portion of the dielectric and typically does not lead to acute failure immediately. Instead, the PD in an insulation system performs as a chronic symptom which develops and eventually causes failure. The characteristics of a PD are "health indicators" which represent the performance of the insulation system in an electrical apparatus. Attempts to detect, analyze, and locate PDs have been made for a long time, including systems designed to measure and analyze acoustic energy emitted by PD pulses, optical energy emitted by PD pulses, and/or electromagnetic energy emitted by PD pulses. In electromagnetic detection systems, induction coupled (magnetic) sensors and capacitive coupled (electrical) sensors have been used.

In electromagnetic terms, a PD pulse is characterized by a fast rise time in the range of sub-nanoseconds (sub-ns) and a signal bandwidth up to the gigahertz (GHz) range at its origin. The initial ns or sub-ns spike is followed by an "ionic portion," which may have a longer duration (about 100 ns). In a shielded power cable, the PD signal propagates along the power cable from its origin, but high frequency components of the signal attenuate more significantly (i.e., over shorter distances) than lower frequency components. Sometimes the signal bandwidth at a detection point is taken as a measure of the distance of propagation in an attempt to locate the origin of the PD.

Aspects of PD measurements are described in:
"Fundamental Limitations in the Measurement of Corona and Partial Discharge," *IEEE Transactions on Electrical Insulation*, Vol. EI-17, No. 2, April 1982;
"Partial discharge detection in cables using VHF capacitive Couplers," *IEEE Transactions on Dielectrics and Electrical Insulation*, Vol. 10, No. 2, April 2003;
and the references cited therein.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The present invention provides a partial discharge (PD) sensor for a PD signal-analyzing system that has a known coupling impedance. The sensor has a capacitor component for capacitive coupling to an electrical power apparatus in which a PD is suspected, such as a shielded power cable. The sensor includes an impedance transformance device having an input side connected directly to the capacitor component and an output side configured for connection to the PD signal-analyzing system. The impedance transformance device is effective to convey a PD signal from the input side to the output side.

In one aspect of the invention the transformance device has a first effective impedance at the input side and a second effective impedance at the output side, the first effective impedance being much larger than the second effective impedance, such as at least two orders of magnitude larger. The capacitance of the capacitor component in combination with the first effective impedance inherently forms a classic high-pass filter, but with a low frequency cutoff much lower than would be caused by the capacitance of the capacitor component in combination with the known coupling impedance of the signal-analyzing system. For example, for a PD signal-analyzing system having a coupling impedance of 50 ohms, the impedance transformance device can have an output impedance that matches the coupling impedance, but with an input impedance at the capacitor component side of at least 5 KΩ. The effect on the low frequency cutoff is to pass much more of the lower frequency components of the PD signal for analysis by the PD signal-analyzing system.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 3A is a simplified circuit diagram of the system represented in FIG. 3;

FIG. 7 is a diagrammatic representation of a third embodiment of an improved capacitive sensor in accordance with the present invention illustrating its use in a PD signal-analyzing system.

DETAILED DESCRIPTION

Figure 1:
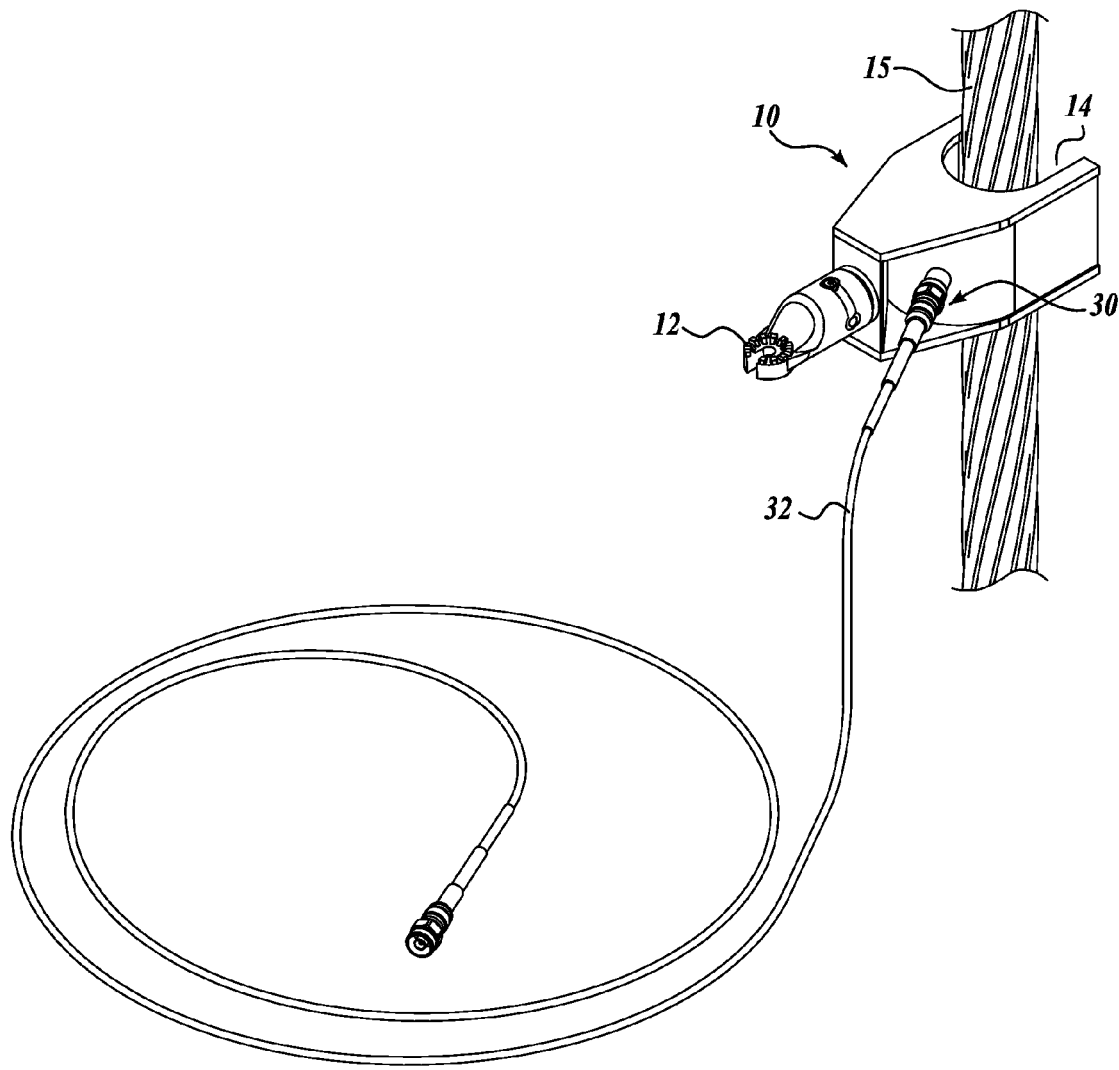
FIG. 1 (prior art) is a diagrammatic representation of a HV shielded power cable and a known capacitive PD sensor and signal transmission line coupled thereto.
Figure 2:
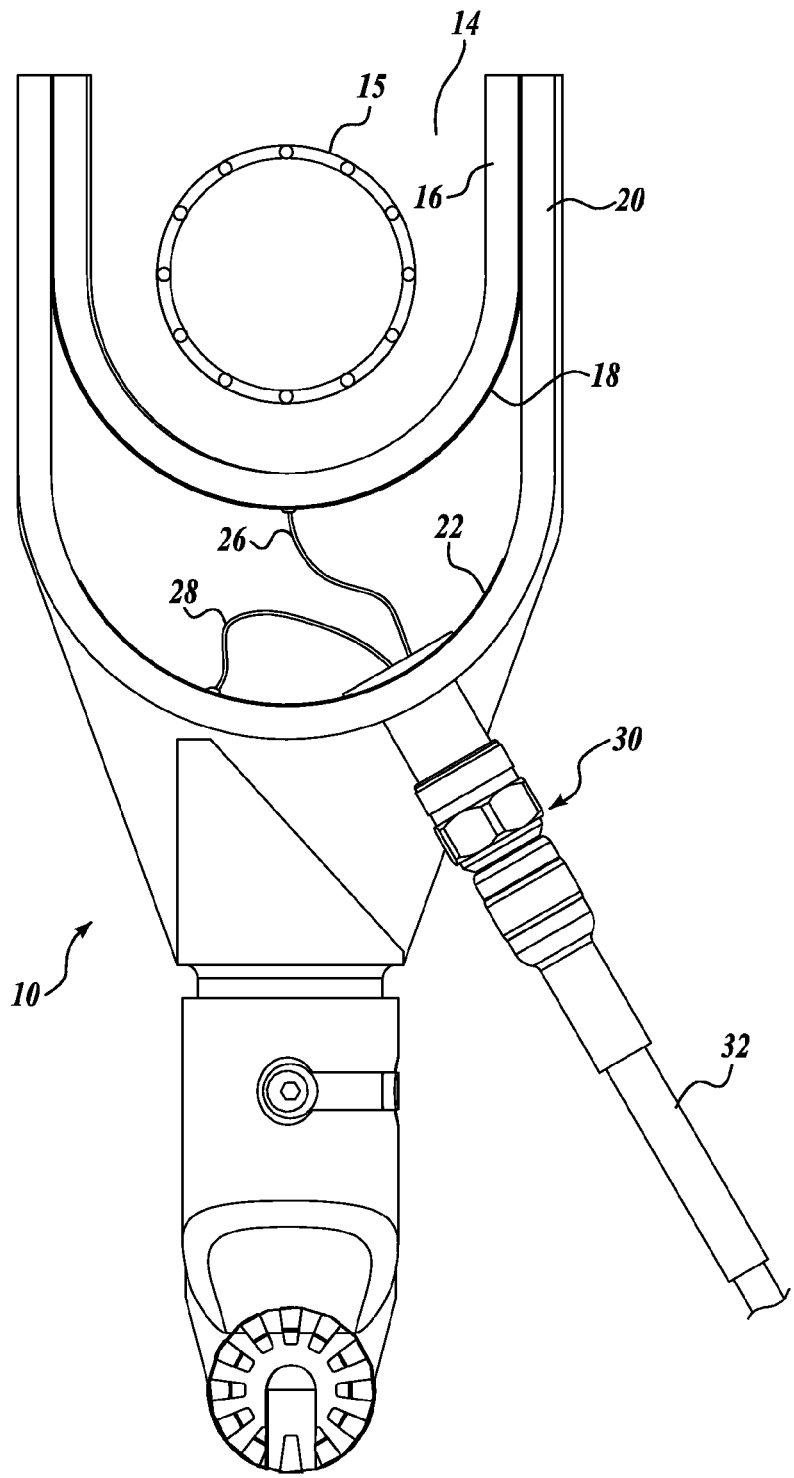
FIG. 2 (prior art) is an enlarged diagrammatic plan view of aspects of the known sensor and line of FIG. 1.

FIGS. 1, 2, 3, and 3A are diagrammatic representations of a capacitive sensor and related components used in the "CableWISE™" service provided by UtilX Corporation of Kent, Wash., (www.utilx.com). That system is used to evaluate the condition of medium voltage (MV) and high voltage (HV) shielded cable systems, transformers and switch gear, by detection and analysis of partial discharge (PD) signals. The system is designed for "online" detection, i.e., it is not necessary to take the system down for testing or to introduce external signals. With reference to FIG. 1, the system uses a capacitive sensing component 10 with a fitting 12 for connection to a pole ("hot stick") that can be used to position the sensor with a U-shaped recess 14 transversely receiving a small segment of the cable 15 under test. As seen in FIG. 2, the cable-receiving recess 14 has an inner U-shaped insulative or dielectric member 16 with a large capacitor plate 18 extending along its outer periphery. A longer U-shaped dielectric element 20 has the other arcuate metallic capacitor plate 22 along its inner periphery. Typically, plates 18 and 22 will be copper bands separated by an air gap or another dielectric. PD pulses conveyed along the cable cause detectable fluctuations in the voltage between the capacitor plates. The voltage fluctuations have the signal that conveys the periodic PD signature to be analyzed. They are picked up by respective conductors 26 and 28 that lead to a standard coupling 30 for a signal transmission line 32 in the form of a coaxial cable. Conductor 26 connects to the coax core, and conductor 28 to the coax sheath. In representative installations, the MV/HV cable to be evaluated may range from 2.4 kV up to 345 kV cable. Sensors are provided in at least 1"-5" sizes for the different cables. In representative embodiments the capacitance achieved by the cable shield 15 and the plate 18 is a significant value, in the range of 10-80 picofarads.

Figure 3:
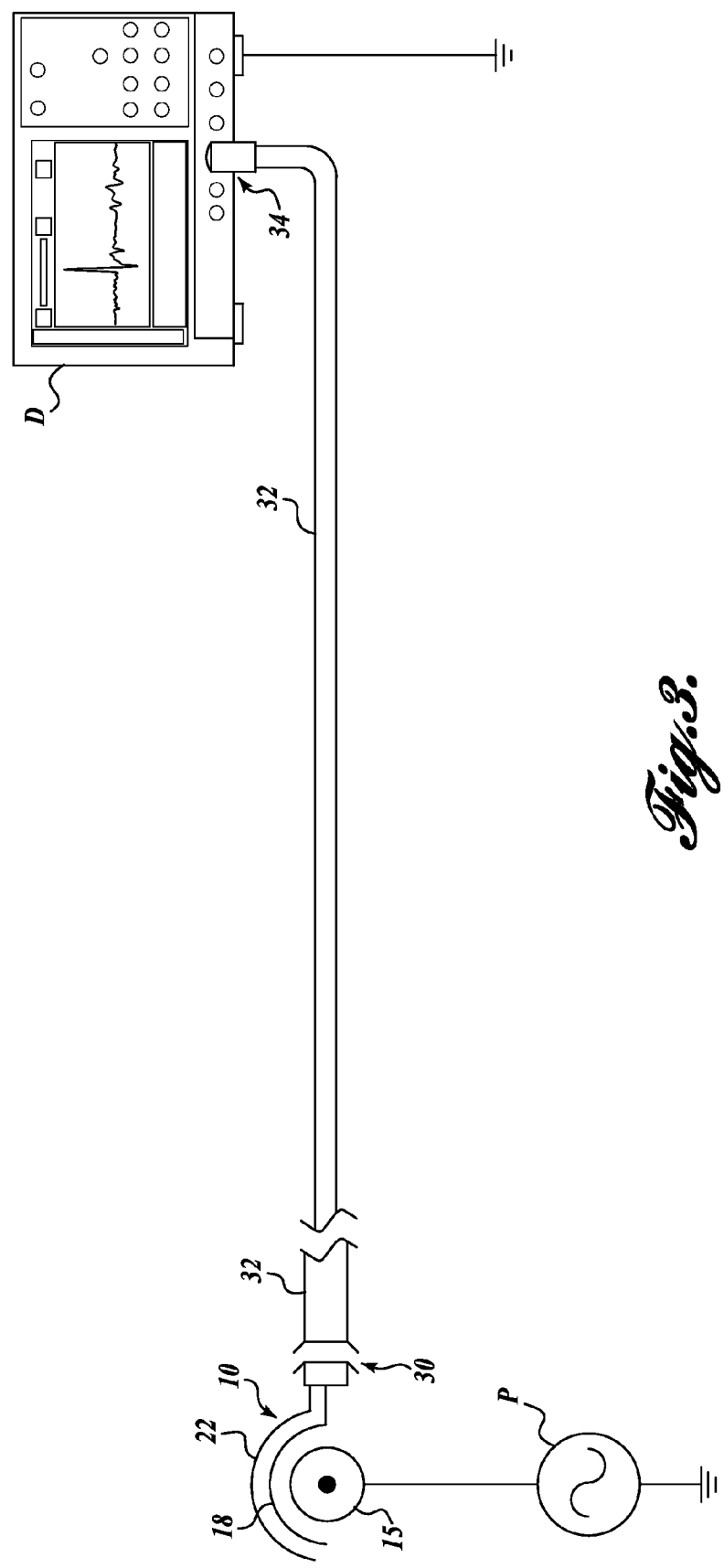
FIG. 3 (prior art) is an even more diagrammatic representation of the sensor and transmission line of FIG. 1, as used in connection with PD signal-analyzing equipment.
Figure 2A:
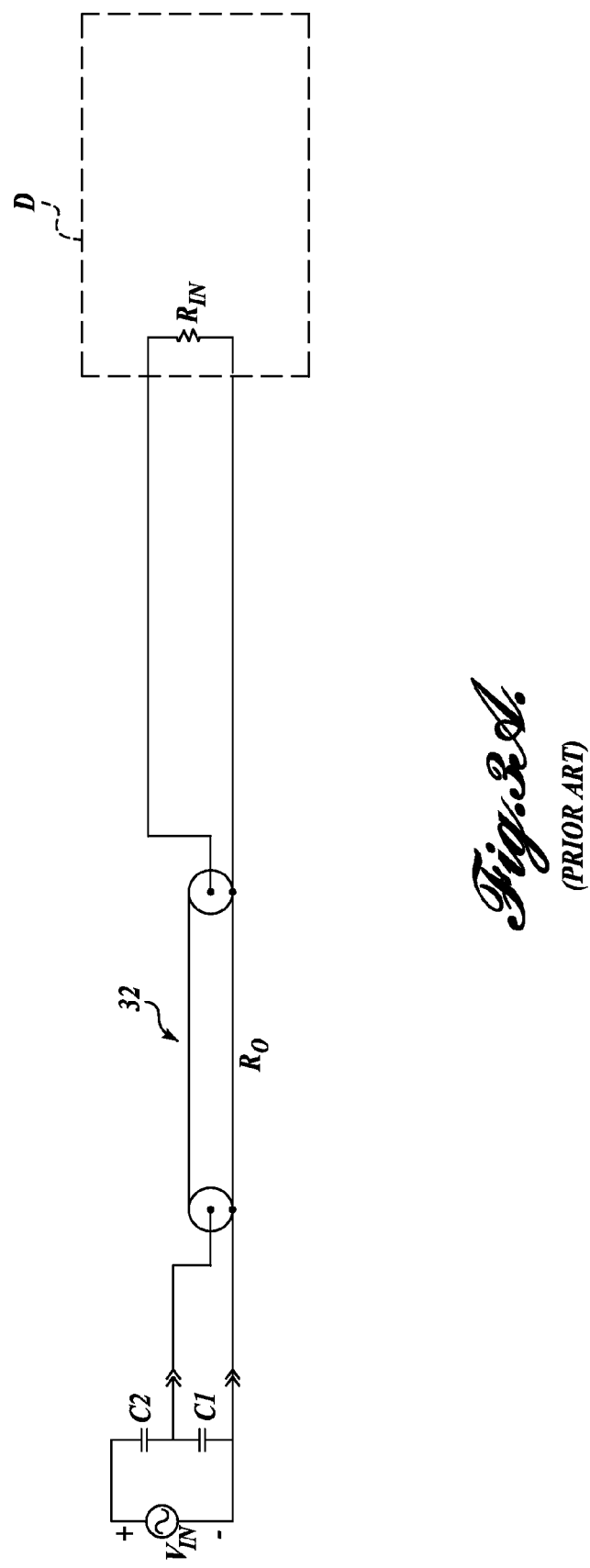

The relationship of the sensor 10 to the signal-analyzing apparatus D is represented in FIG. 3. Cable 15 carries the HV AC current. A PD discharge signal is represented at P, which typically is generated at some distance from the sensor. The capacitor plates 18, 22, are connected, respectively, to the core and sheath conductors of the coaxial cable 32 through the standard coupling 30. The length of the cable can be quite long. For example, the hot stick itself may be 6 feet to 30 feet long. The other end of the signal transmitting coaxial cable is coupled to the PD signal-analyzing apparatus D, such as by a standard coupling 34. As described herein, the signal transmitting component 32 (in this case the standard coaxial cable) is part of the signal-analyzing system and has a known characteristic impedance. In a representative embodiment, a cable with characteristic impedance of 50 ohms is used. This is the coupling impedance presented to the output side of the sensor. It is important to match the impedance of the cable to the input impedance of the signal-analyzing equipment to prevent reflections.

A simplified representation of the traditional capacitive sensor circuit is shown in FIG. 3A. $V_{IN}$ represents the effective PD pulse conveyed along the cable (15 in FIG. 3). $C_2$ represents the value of the inherent capacitance between the outer periphery of the shielded cable and the adjacent plate (plate 18 in FIG. 3) of the sensor capacitor, and $C_1$ represents the capacitance of the spaced sensor plates (18 and 22 in FIG. 3). In this system, the signal to be transmitted to the signal-analyzing equipment D consists of the PD characterizing voltage across the sensor capacitor $C_1$. The characteristic impedance $R_0$ of the signal transmission component (which is matched to the input impedance $R_{IN}$ of the signal-analyzing equipment) is the coupling impedance and results in a resistive load to the sensor, e.g., 50 ohms, which forms an inherent classic high-pass filter, the lower cutoff frequency being a function of $1/2\pi RC$. In a representative embodiment, the 3 dB cutoff point is at approximately 100 MHz (using the example of a 50 ohm coaxial cable for transmission of the signal to signal-analyzing equipment with an input impedance of 50 ohms and a sensor capacitance of approximately 30 picofarads).

Figure 4:
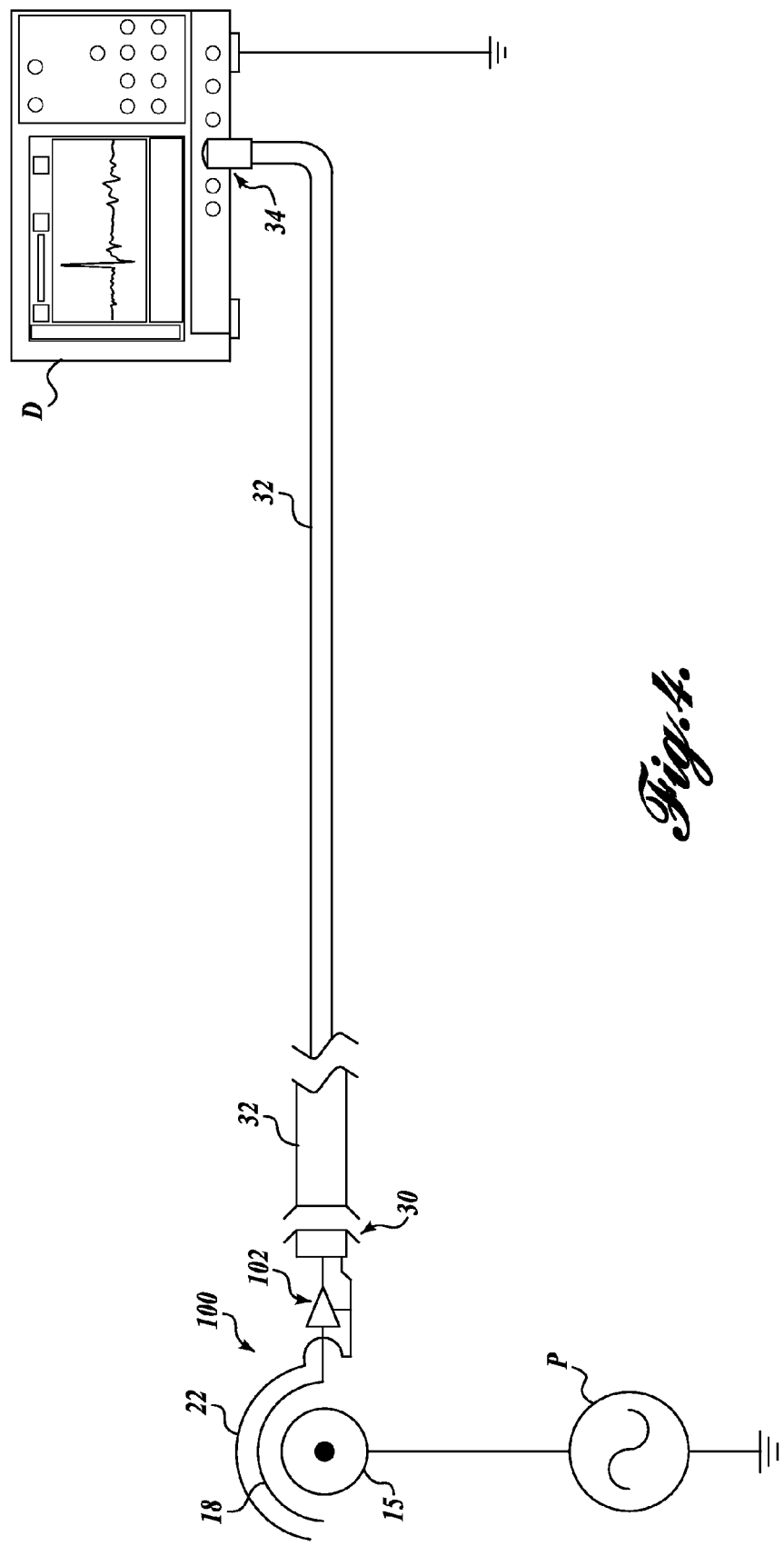
FIG. 4 is a diagrammatic representation of a first embodiment of an improved capacitive sensor in accordance with the present invention illustrating its use in a PD signal-analyzing system.

The present invention provides a capacitive sensor that still may be used with conventional signal transmission and signal-analyzing equipment, but which provides much greater performance for lower frequency signals. With reference to FIG. 4, in a first embodiment of an improved sensor 100 in accordance with the present invention, an impedance transformance component 102 is provided between the capacitor defined by the plates 18, 22 and the signal transmission component 32. The impedance transformance occurs directly adjacent to the sensor capacitor. For example, the distance between the coupling capacitor and the input side of the transformance component should be less than 10 cm to avoid significant stray capacitance, conductance, and signal reflection. In a preferred implementation, the input impedance at component 102 is at least two orders of magnitude greater than the output impedance. As noted above, the output impedance is equal to the characteristic impedance of the transmission line 32 which, in turn, matches the input impedance of the signal-analyzing system D.

Figure 4A:
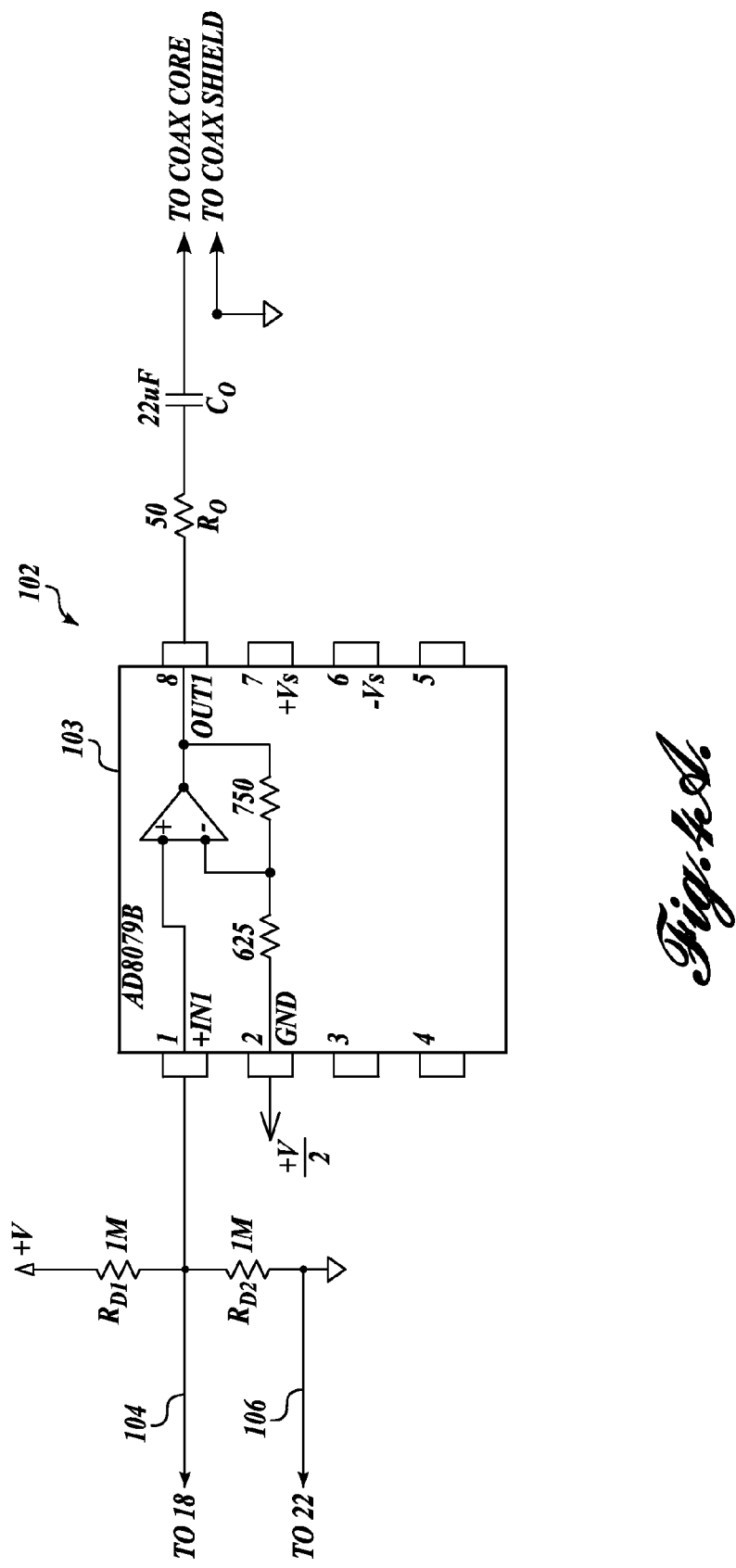
FIG. 4A is a simplified circuit diagram of the sensor of FIG. 4.

One implementation is shown in more detail in FIG. 4A. Starting at the left, conductors 104 and 106 extend from the sensor capacitor plates 18 and 22, respectively. These connect to a voltage divider network having resistors $R_{D1}$ and $R_{D2}$ from a DC power source +V (a 9V battery in a representative implementation). The voltage divider provides a DC bias to the input pin of an integrated circuit 103 (for example, Analog Devices AD8079 buffer amplifier). The voltage divider and integrated circuit provide the desired high input impedance which is about 500 KΩ in this embodiment. The buffer amplifier is configured with unity gain. A resistor $R_O$ is connected to the output to match the coupling impedance, in this case the characteristic impedance of the signal transmission line (coax cable), and an output capacitor $C_O$ for DC isolation.

Figure 5:
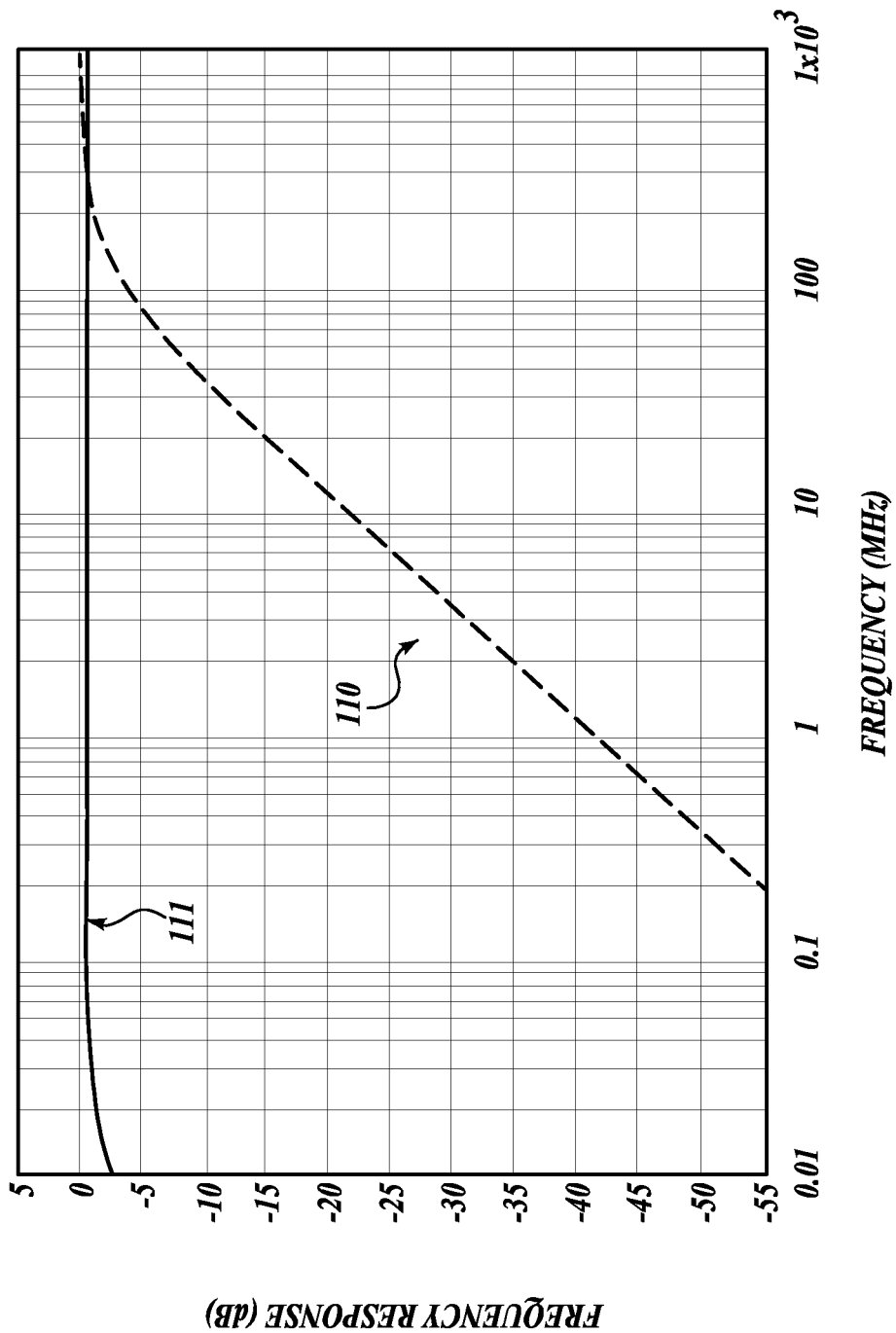
FIG. 5 is a graph Illustrating the frequency filtering aspects of the prior art sensor represented in FIG. 3A, and the filtering aspects of the improved sensor represented in FIG. 4A.

FIG. 5 shows the effect of the impedance transformance component on the frequency response for the signal supplied along the transmission line. The dash line 110 on the graph represents the frequency response for the known sensor described with reference to FIGS. 1 to 3A. The 3 dB cutoff occurs at about 100 MHz although in some systems it may be 40 MHz depending on the capacitance of the sensor in use. The solid line 111 represents the frequency response achieved when a sensor in accordance with the present invention is used. Incorporating the impedance transformation component adjacent to the coupling capacitor results in the low cutoff frequency being reduced tremendously, to approximately 10 KHz in the representative example. This provides a significant advantage for the improved sensor as compared to the prior art sensor, particularly in terms of the distance at which a PD can be detected. In a typical 15 KV cable, because attenuation is greater at high frequencies than at lower frequencies, the PD signal may have a bandwidth of up to 1 GHz at its origin, but 20 MHz at a distance of 100 m, and 4 MHz at a distance of 500 m. Since the sensor in accordance with the present invention passes much more of the lower frequency bandwidth, it is effective at greater distances for PD detection using otherwise conventional signal-analyzing systems.

There is a considerable range for the preferred lower cutoff frequency for the sensor in accordance with the present invention. In an AC system it is preferred that the lower cutoff frequency be high enough to reject the power frequency and its measurable harmonics, which typically includes 60 Hz to approximately 2000 Hz. In the preferred embodiment, the lower cutoff frequency is at least 4000 Hz to achieve the desired rejection with a considerable margin of safety. In a different implementation the lower cutoff frequency could be higher. For example, even a lower cutoff frequency of 1 MHz provides a 100 fold improvement as compared to the 100 MHz cutoff of the known sensor. In terms of the input impedance, these cutoff frequencies correspond to about 100 to 10,000 times the output impedance (the characteristic impedance $R_O$ of the signal transmission line). For a characteristic impedance $R_O$ of 50 ohms, the preferred range for the input impedance is 5 KΩ to 500 KΩ.

Figure 6:
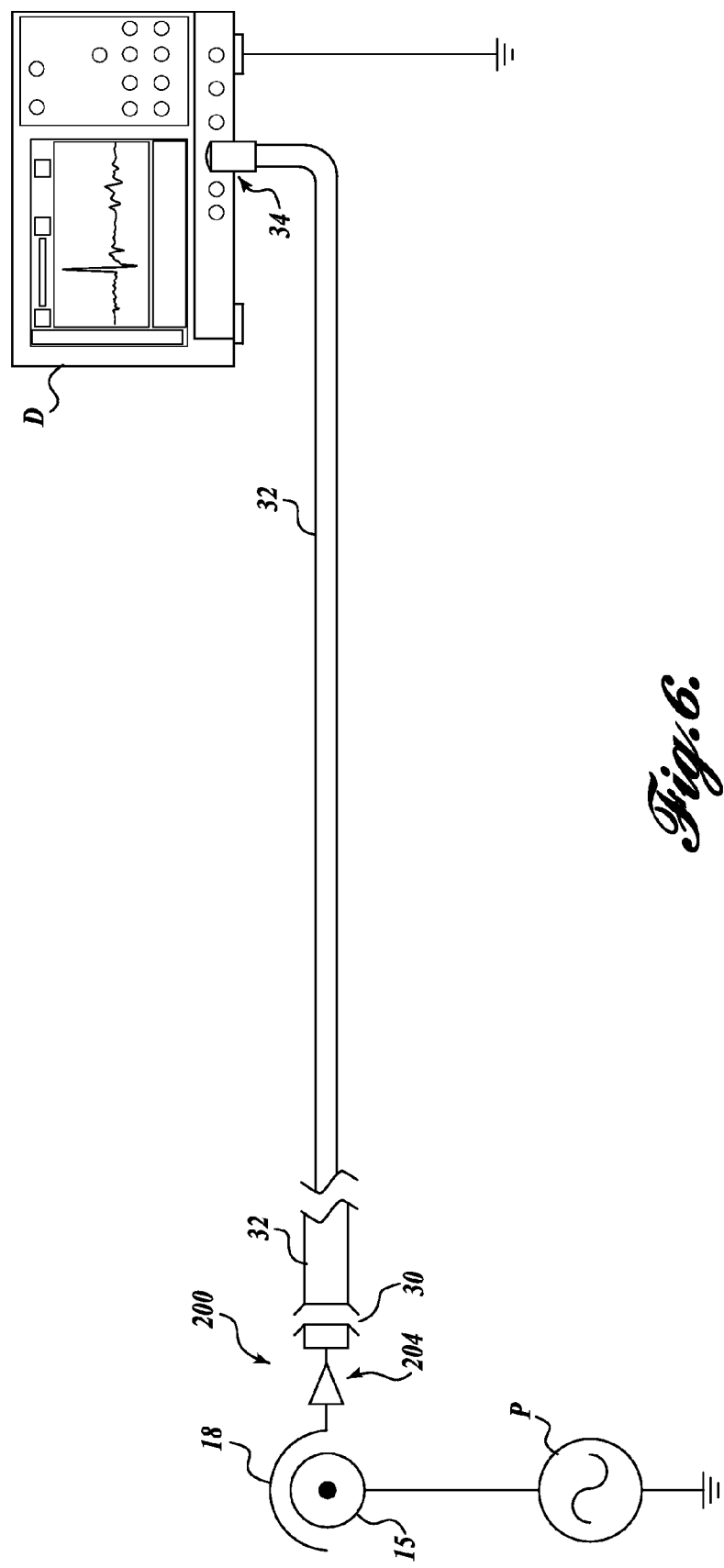
FIG. 6 is a diagrammatic representation of a second embodiment of an improved capacitive sensor in accordance with the present invention illustrating its use in a PD signal-analyzing system.
Figure 6A:
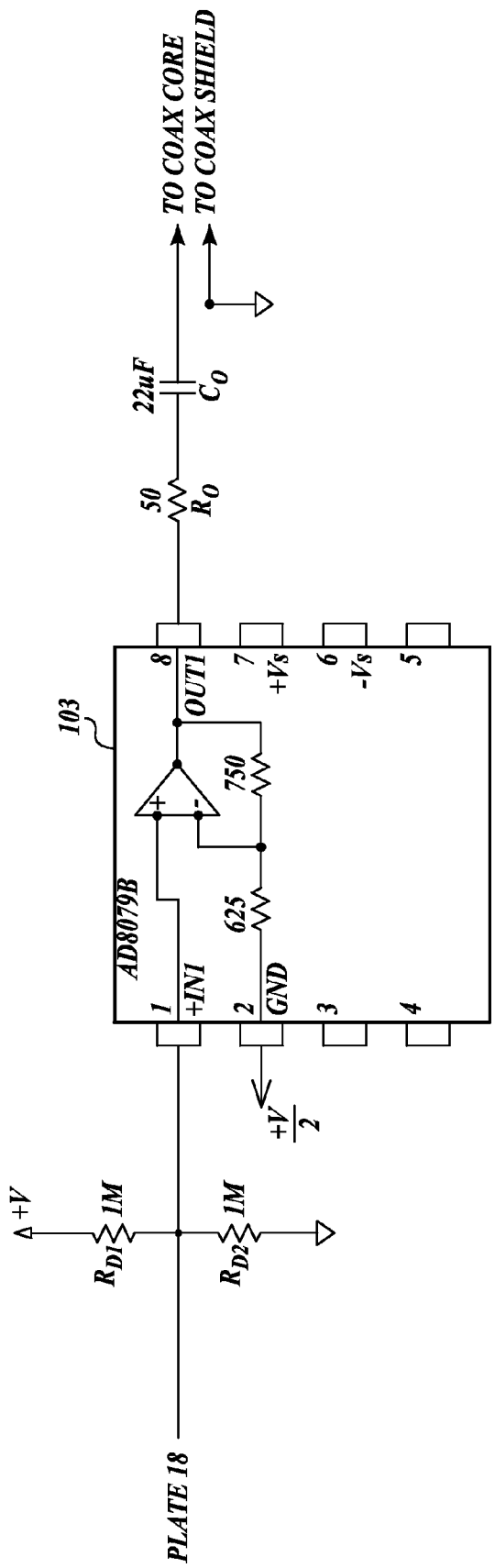
FIG. 6A is a simplified circuit diagram of the sensor of FIG. 6.

In the embodiment of the present invention represented in FIG. 6, for which the circuit is shown in FIG. 6A, the sensor 200 in accordance with the present invention uses a single capacitor plate 18 and utilizes the inherent capacitance between that plate and the sheathed cable 15. As seen in FIG. 6A, the circuit for the impedance transformation device is very similar to the circuit shown in FIG. 4A. The IC buffer, output impedance $R_O$, output capacitance $C_O$, and input voltage bias provided by the 9V battery and voltage divider are the same as previously described. Rather than coupling a two-plate capacitor across the lower resistor of the voltage divider ($R_{D2}$) as in the embodiment shown in FIG. 4A, the voltage signal at the inner plate 18 is coupled to the IC input. The system ground completes the circuit. The frequency response is very close to the frequency response for the embodiment of FIG. 4A. The low frequency cutoff is greatly improved as compared to the prior art sensor but somewhat higher than for the embodiment of FIG. 4A because the capacitance component of the defining ratio 1/2πRC is of lesser magnitude than for the embodiment of FIG. 4A. Such cutoff still is far below cutoff inherent in the prior art capacitive sensor.

Figure 7A:
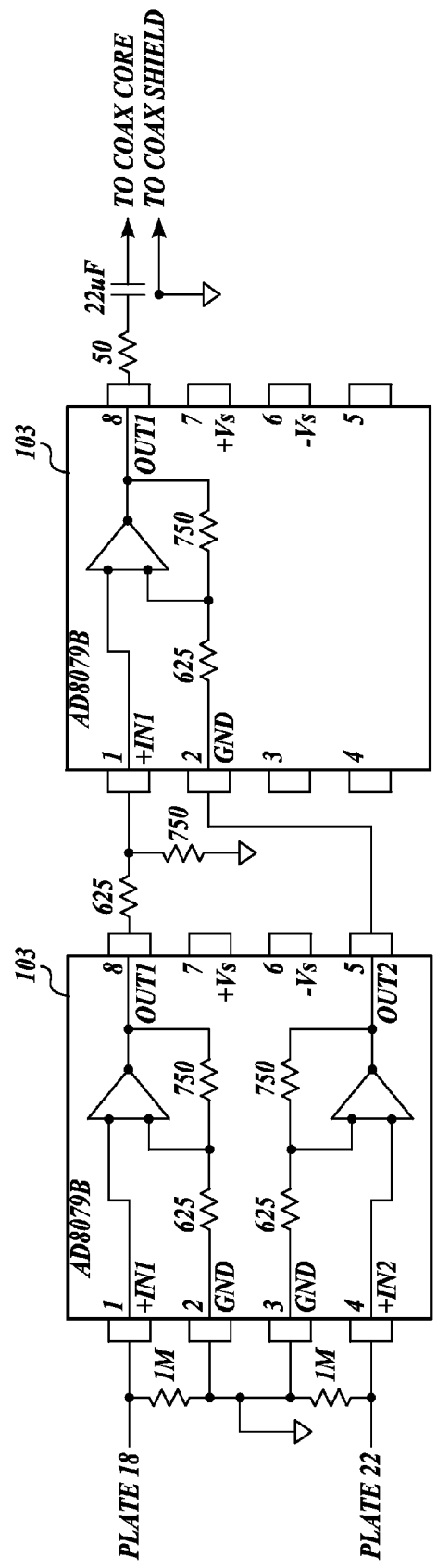
FIG. 7A is a simplified circuit diagram of the sensor of FIG. 7.

In the embodiment of the present invention shown in FIGS. 7 and 7A, the improved sensor 300 in accordance with the present invention is implemented with a differential amplifier for which the circuit is shown in FIG. 7A. The coupling capacitor plates 18 and 22 provide the inputs to the top and bottom bands of the IC buffer 103. The differential outputs then are coupled to a single band of a second IC buffer as shown for a differential to single-ended conversion. Since the apparent input impedance still is very high (much greater than the preferred lower limit of 5 KΩ) and the output impedance is set to match the coupling impedance of the signal-analyzing system, the frequency response is still enhanced greatly with respect to the frequency response of the prior art sensor. By utilizing a differential input, the ground loop noises are cancelled out such that they are not transmitted to the signal-analyzing apparatus D over the signal transmission line 32. Only the signal appearing between the plates 18 and 22 (across $C_1$) is detected. The benefit is an enhanced signal-to-noise ratio (SNR).

Figure 8:
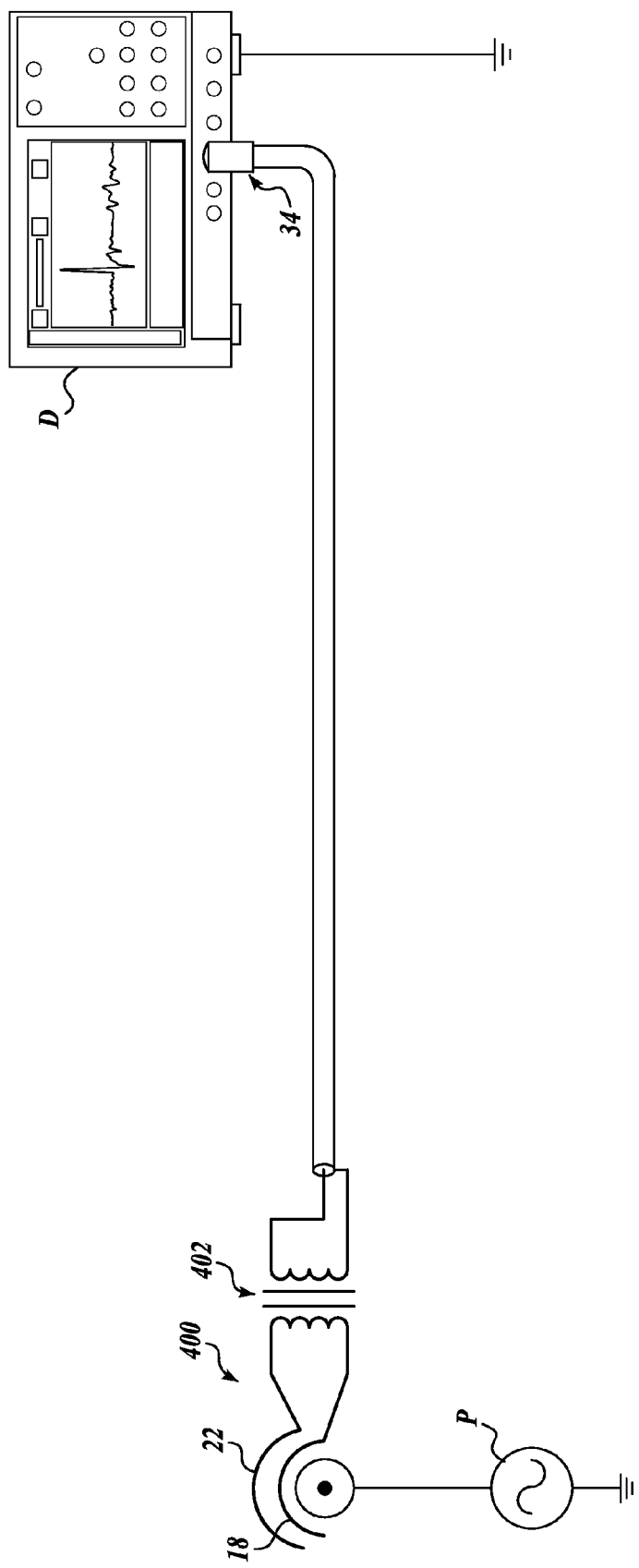
FIG. 8 is a diagrammatic representation of a fourth embodiment of an improved capacitive sensor in accordance with the present invention illustrating its use in a PD signal-analyzing system.

In the embodiment of the present invention shown in FIG. 8, the improved sensor 400 is implemented by incorporating a coupling transformer 402. The primary winding of the transformer is connected to the sensor plates 18 and 22, and the secondary winding is connected to the signal transmission line 32. The transformer provides two benefits over the prior art. Firstly, it presents a relatively high impedance load to the sensor, extending the low frequency cutoff frequency providing benefits as described earlier. The impedance is determined by the equation:

$$Z_{transformer} = N^2 * R_0$$

where N is the transformer turns ratio and $R_0$ is the characteristic impedance of the signal transmission line. For example, a transformer turns ratio of 10:1 and a coaxial cable characteristic impedance of 50 ohms would present a 5000 ohm impedance to the sensor. This would then provide a low frequency cutoff of approximately 400 KHz, more than a 100 fold improvement over the prior art. Even a turns ratio of 5:1 would provide a 25 fold improvement which may be useful for some applications.

The second benefit is that the transformer converts from a differential input to a single ended output which is then connected to the signal transmission line 32. This helps to isolate the ground loop noise from the signal-analyzing apparatus D. This benefit is similar to that described for sensor embodiment 300. However, the transformer will attenuate all signals, but a very low noise preamplifier can be used to raise the signal level back to a useful level.

While illustrative embodiments have been illustrated and described, it will be appreciated that various changes can be made therein without departing from the spirit and scope of the invention.

The embodiments of the invention in which an exclusive property or privilege is claimed are defined as follows:

1. A PD sensor for a PD signal-analyzing system having a known coupling, said sensor comprising:
   a capacitor component having a predetermined capacitance for capacitive coupling to an electrical power apparatus in which a PD is suspected at a location distant from the sensor; and
   an impedance transformation device including a buffer amplifier having an input side connected directly to the capacitor component and an output side configured for connection to a PD signal-analyzing system having a known coupling impedance, the impedance transformance device being constructed and arranged to convey a PD signal from the input side to the output side, the impedance transformance device having a first effective impedance at the input side and a second effective impedance at the output side, the first effective impedance being much larger than the second effective impedance;
   whereby the capacitance of the capacitor component in combination with the first effective impedance inherently effects a low frequency filter cutoff much lower than the low frequency cutoff that would be caused by the capacitance of the capacitor component in combination with the known coupling impedance, and said low frequency cutoff includes a bandwidth of low frequencies for indicating the occurrence of a PD at a distance from the sensor.

2. The sensor defined in claim 1, in which the second impedance matches the known coupling impedance.

3. The sensor defined in claim 2, in which the first impedance is 100 to 10,000 times the second impedance.

4. The sensor defined in claim 1, in which the first impedance is at least two orders of magnitude greater than second impedance.

5. The sensor defined in claim 1, in which the capacitance of the capacitor component in combination with the first effective impedance inherently effects a low frequency filter cutoff of at least 4 KHz.

6. The sensor defined in claim 5, in which the capacitance of the capacitor component in combination with the first effective impedance effects a low frequency filter cutoff between 4 KHz and 1 MHz.

7. The sensor defined in claim 1, in which the buffer amplifier has unity gain.

8. The sensor defined in claim 1, in which the impedance transformance device includes a transformer with a winding ratio of at least 5:1.

9. The sensor defined in claim 1, in which the first impedance is 25 to 10,000 times the second impedance.

10. The sensor defined in claim 1, in which the impedance transformance device includes a differential amplifier.

11. The sensor defined in claim 1, in which the output side is adapted for connection to a signal transmission line having a characteristic impedance that determines the coupling impedance.

12. The sensor defined in claim 1, in which the capacitor component has two conductive plates spaced apart and mounted for placement adjacent to an electrical power apparatus in which a PD is suspected for capacitive coupling therewith.

13. The sensor defined in claim 1, in which the capacitor component has a single conductive plate mounted for placement adjacent to an electrical power apparatus in which a PD is suspected for capacitive coupling therewith.

14. The sensor defined in claim 1, in which the capacitor component is adapted for capacitive coupling with a shielded power cable to sense PD signals in the cable and pass the sensed PD signals to the impedance transformance device.

15. The PD sensor of claim 1, further comprising a signal analyzer for identifying the bandwidth of a received PD signal.

16. The PD sensor of claim 1 for sensing a PD at a distance 100 meters or more from the source of the PD.

17. The PD sensor of claim 16 wherein the sensor detects a 20 MHz bandwidth of the PD.

18. The PD sensor of claim 1 for sensing a PD at a distance 500 meters or more from the source of the PD.

19. The PD sensor of claim 18 wherein the sensor detects a 4 MHz bandwidth of the PD.

20. The PD sensor of claim 1 wherein the electrical apparatus comprises one or more of the group consisting of medium voltage (MV) and high voltage (HV) shielded cable systems, transformers, and switch gear.

21. The PD system of claim 1 wherein the electrical apparatus comprises one or more of the group consisting of medium voltage (MV) and high voltage (HV) shielded cable systems, transformers, and switch gear.

22. A PD detection system comprising:
a signal-analyzing device for analyzing frequencies of a PD signal generated in an electrical power apparatus at a location distant from the PD detection system;
a transmission line connected to the signal-analyzing device for conveying the PD signal thereto, the signal-analyzing device and the transmission line forming a signal-analyzing system having a known coupling impedance; and
a sensor for detecting the PD signal in the electrical power apparatus and for passing the PD signal to the transmission line, the sensor having
a capacitor component having a predetermined capacitance for capacitive coupling to the electrical power apparatus to pick up the PD signal generated in the electrical power apparatus;
an impedance transformance device including a buffer amplifier having an inputside connected directly to the capacitor component and an output side configured for connection to the transmission line of the signal-analyzing system, the impedance transformance device being constructed and arranged to convey the PD signal from the input side to the output side, the impedance transformance device having a first effective impedance at the input side and a second effective impedance at the output side, the first effective impedance being much larger than the second effective impedance, and the second effective impedance being selected to match the known coupling impedance;
whereby the capacitance of the capacitor component in combination with the first effective impedance inherently effects a low frequency filter cutoff much lower than the low frequency cutoff that would be caused by the capacitance of the capacitor component in combination with the known coupling impedance, and said low frequency cutoff includes a bandwidth of low frequencies for indicating occurrence of a PD at a distance from the PD sensor.

23. The PD detection system defined in claim 22, in which the impedance transformation device has a first effective impedance 100 to 10,000 times the second effective impedance.

24. The PD detection system defined in claim 22, in which the capacitance of the capacitor component in combination with the first effective impedance effects a low frequency filter cutoff between 4 KHz and 1 MHz.

25. The PD detection system defined in claim 22, in which the impedance transformance device includes a differential amplifier.

26. The PD detection system defined in claim 22, in which the impedance transformance device includes a transformer with a winding ratio of at least 5:1.

27. The PD detection system defined in claim 22, in which the first impedance is 25 to 10,000 times the second impedance.

28. The PD sensor of claim 22 wherein the signal-analyzing device identifies the bandwidth of a received PD signal.

29. The PD system of claim 22 for sensing a PD at a distance 100 meters or more from the source of the PD.

30. The PD system of claim 29 wherein the sensor detects a 20 MHz bandwidth of the PD.

31. The PD system of claim 22 for sensing a PD at a distance 500 meters or more from the source of the PD.

32. The PD system of claim 31 wherein the sensor detects a 4 MHz bandwidth of the PD.

* * * * *